United States Patent [19]
Tkazyik et al.

[11] Patent Number: 4,941,830
[45] Date of Patent: Jul. 17, 1990

[54] EDGE DESIGN FOR PRINTED CIRCUIT BOARD CONNECTOR

[75] Inventors: William J. Tkazyik, Hyde Park, N.Y.; Robert G. Urfer, New Milford, Conn.

[73] Assignee: International Business Machines Corp., Armonk, N.Y.

[21] Appl. No.: 227,026

[22] Filed: Aug. 1, 1988

[51] Int. Cl.⁵ .............................................. H01R 9/09
[52] U.S. Cl. ...................................... 439/59; 439/630
[58] Field of Search ................. 439/55, 59, 60, 61, 439/62, 630, 260, 637, 76

[56] References Cited

U.S. PATENT DOCUMENTS 4,708,415 11/1987 White ..................... 439/59

FOREIGN PATENT DOCUMENTS 2254928 7/1975 France ..................... 439/59
2460552 1/1981 France ..................... 439/59
2138222 10/1984 United Kingdom ........ 439/59

Primary Examiner—Neil Abrams
Assistant Examiner—Khiem Nguyen
Attorney, Agent, or Firm—Floyd A. Gonzalez

[57] ABSTRACT

An improved edge design for a printed circuit board used with a connector having spring biased contact members. The printed circuit board has a nose piece bonded thereon which is made of a lubritious, insulating material for deflecting the spring biased contact members without causing damage to the members or the electrical contacts thereon. In a preferred embodiment, each spring biased member is fixed in the connector at one end and has a bent portion with an electrical contact on the bent portion. The electrical contact is in an impact protected position when its spring biased member is undeflected, and moves to a contact making position for contact with an input/output tab on the printed circuit board as the spring biased member is deflected around its fixed end during the plugging in operation of the printed circuit board.

6 Claims, 2 Drawing Sheets

EDGE DESIGN FOR PRINTED CIRCUIT BOARD CONNECTOR

BACKGROUND OF THE INVENTION

The present invention relates to printed circuit board connectors, and more particularly relates to an improved edge design of the edge of the printed circuit board for use with printed circuit board connectors.

Printed circuit board connectors are known in which spring members urge electrical contact members into electrical connection with input/output means such as gold tabs on the printed circuit board as the edge of the printed circuit board is inserted into the connector. The edge of the printed circuit board is typically beveled to push the spring loaded electrical contact member into a contacting position as the edge of the printed circuit board moves past the electrical contact member. The beveling of the edge of the printed circuit board exposes the ends of glass fibers in the substrate of the printed circuit board such that as the beveled edge of the printed circuit board pushes past the spring loaded electrical contact member, the ends of the glass fibers damage the electrical contact member. As the damaged electrical contact member then moves over the gold tabs of the printed circuit board, it in turn damages the gold tabs. This damage severely limits the number of times which a printed circuit board may be plugged into a printed circuit board connector before failure.

U.S. Pat. No. 3,951,492 issued April 20, 1976 to Braund for "Trapped Bow Contact and Connector Using the Same" discloses a printed circuit board connector in which the leading edge of the printed circuit board bows a contact to make an electrical connection.

U.S. Pat. No. 4,157,857 issued June 12, 1979 to Sabo for "Edge Connector for Printed Circuit Boards" discloses a printed circuit board connector in which electrical connection is made with a gold contact on the edge of the printed circuit board as it is inserted into the connector. The connector is designed to minimize wear as the board is forced into the connector.

U.S. Pat. No. 4,221,448 issued Sept. 9, 1980 to Logerot et al. for "Connector for Printed Circuit Boards" discloses a connector having a resilient contact which is designed to make electrical contact with a conductor pad on the side of a printed circuit board as the printed circuit board is inserted into the connector. The edge of the printed circuit board is designed to co-act with the resilient contact such that a bulge on the resilient contact applies increasing lateral force against the conductor pad as the board continues to be inserted.

U.S. Pat. No. 4,572,604 issued Feb. 25, 1986 to Ammon et al. for "Printed Circuit Board Finger Connector" discloses an electrical connector for the terminating edge of a printed circuit board which, when connected to the terminating edge of the printed circuit board, engages bowed portions of contact fingers in a card edge connector. The leading edge of the electrical connector, when connected to the printed circuit board, includes a bevel for guiding the connector into the card slot of a conventional printed circuit board card edge connector.

U.S. Pat. No. 4,613,193 issued Sept. 23, 1986 to Beers for "Board-Operated Electrical Connector for Printed Circuit Boards" and U.S. Pat. No. 4,634,210 issued Jan. 6, 1987 to Crawford for "Electrical Connectors" each discloses another printed circuit board connector in which the leading edge of the printed circuit board activates an activating mechanism to move contacts into electrical connection with conductor pads on the sides of the printed circuit board as the printed circuit board is inserted into the connector.

SUMMARY OF THE INVENTION

The present invention relates to an improved printed circuit board design in which a nose piece is bonded to the leading edge of the printed circuit board such that electrical contacts of a connector are not damaged as the printed circuit board is inserted into the connector.

It is an object of the present invention to provide an improved printed circuit board which may be repeatedly plugged into and removed from a printed circuit board edge connector without damaging the electrical contacts of the connector.

It is another object of the present invention to provide an improved printed circuit board edge design in which the printed circuit board edge includes a nose piece made of a lubricious, electrically insulating material for increasing the plug-in operations of the printed circuit board into an edge connector without causing damage to electrical contacts of the connector.

It is another object of the present invention to provide an improved resilient electrical contact in a printed circuit board edge connector which minimizes damage to an electrical contact area as the leading edge of a printed circuit board is inserted into the edge connector.

The foregoing and other objects, features and advantages of the invention will be apparent from the following more particular description of the preferred embodiment of the invention as illustrated in the drawings.

DESCRIPTION OF THE PREFERRED EMBODIMENT

Figure 1:
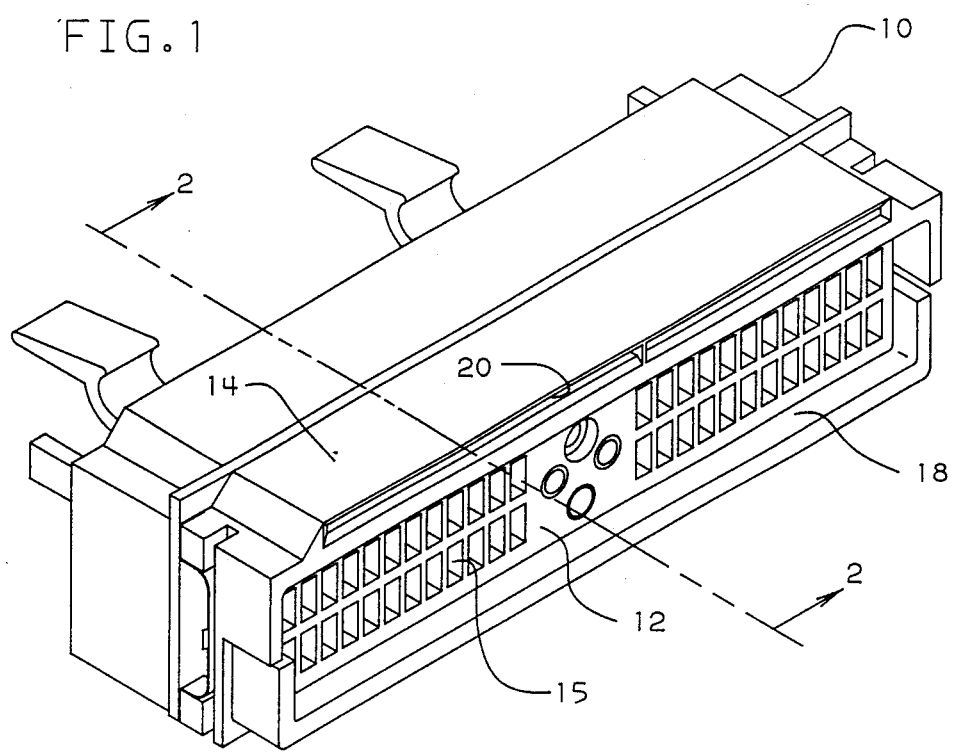
FIG. 1 is a perspective drawing of a connector usable with the present invention.

FIG. 1 is a perspective drawing of a connector 10 having a spade connector portion 12 and a printed circuit board edge connector portion 14. The spade connector portion 12 includes a plurality of openings such as opening 15, each containing jaws 16 designed to resiliently grip and make electrical contact with a spade (not shown) inserted into the opening 15. The openings 15 are arranged in the spade connector portion 12 in a socket 18 designed such that when a socket of a mating connector (not shown) is engaged with the connector 10, the holes 15 are aligned with spade connectors for making electrical connections. Any number of known connectors, such as the spade connector shown and described, may be used with the present invention with equal facility. The present invention is not limited to use with any particular connector and may, in fact, be used with any connector design, or may be used alone as a printed circuit board edge connector. The printed circuit board connector 14 is provided for plugging a printed circuit board into the connector 10 separate and apart from the connections made by connector portion 12.

Figure 2:
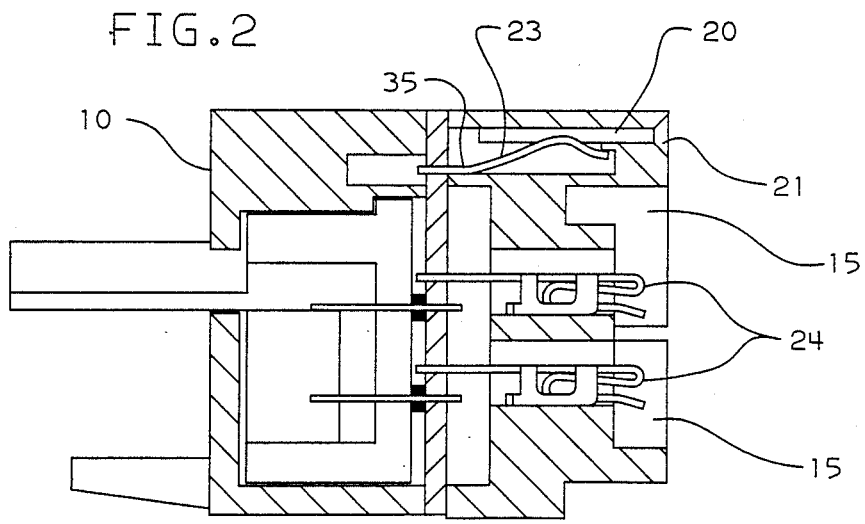
FIG. 2 is an elevational drawing of the connector taken along section line 2—2 of FIG. 1.

The printed circuit board edge connector portion 14 is formed on one side of the connector 10, and includes a slot or slots 20 having a beveled mouth or opening 21 (see FIG. 2) for guiding the leading edge of a printed circuit board into the slot 20. As shown in FIG. 2, a plurality of spring members 23 are located in the slot 20 and include a contact portion, to be discussed later, for making electrical contact with conductor tabs on the side of the printed circuit board. As the disclosed printed circuit board edge connector portion 14 is designed to have a minimum width, there is not enough room to include within the connector portion 14 reduced or zero force insertion mechanisms as are found in prior art printed circuit board edge connectors.

If the spade connector embodiment of FIG. 1 is used, the holes 15 contain clips 24 for engaging spades (not shown) which are inserted into the holes 15 when an electrical connection is made by the spade connector portion 12.

Figure 3:
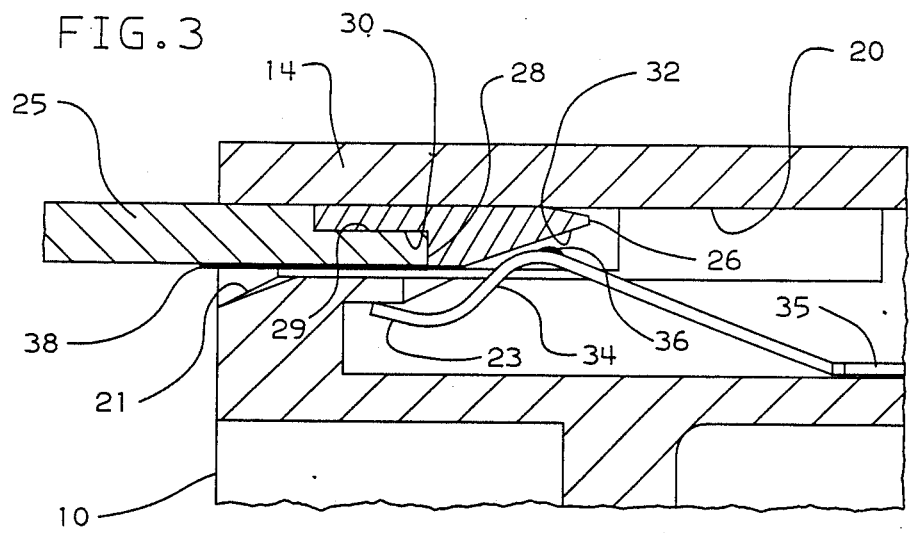
FIG. 3 is an elevational drawing of a partial section of the connector of FIG. 1 looking opposite from the direction of FIG. 2, and having the edge of a printed circuit board partially inserted therein.
Figure 4:
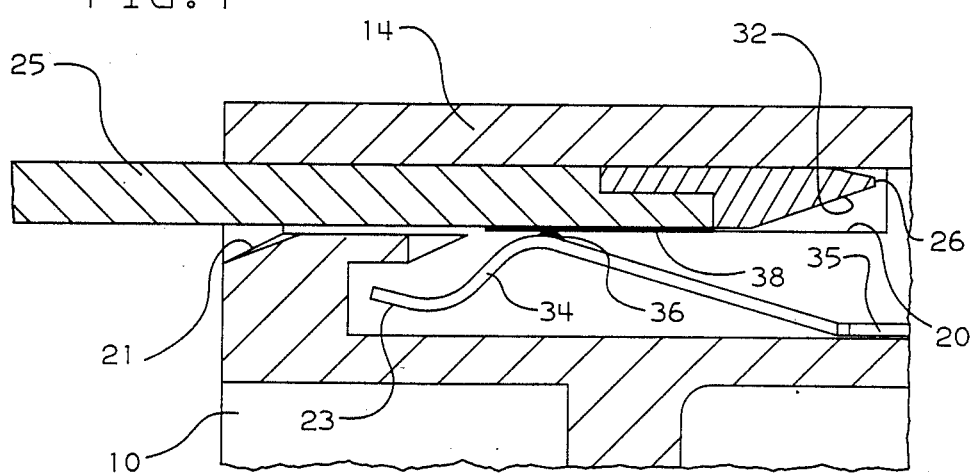
FIG. 4 is another elevational drawing of a partial section of the connector of FIG. 1 with the edge of the printed circuit board of FIG. 3 fully inserted therein.

FIG. 3 is an elevational view of a partial section of the connector 10 having a printed circuit board 25 partially inserted into the slot 20, and showing one of the spring members 23 of FIG. 1. The circuit board 25 has a nose piece 26 bonded on its leading edge 28. In the illustrated embodiment, both the leading edge 28 and the nose 26 have cooperating stepped portions 29 and 30, respectively, forming a babbit type joint. The forward portion of the nose piece 26 is slanted at 32 to cooperate with a bent portion 34 of the spring member 23. The spring member 23 is fixed at one end 35 (see FIGS. 2 and 3) to the connector 10 such that when the slanted portion 32 of the nose piece 26 engages the bent portion 34, the spring member 23 is deflected away from the nose piece 26 as shown in FIG. 4. It will be understood that the printed circuit board has a number of gold tabs 38 as part of its printed electrical circuit, typically one for each spring member 23. The spring member 23 carries an electrical contact 36 which, when the printed circuit board 25 is fully inserted into the slot 20, makes electrical contact with a respective one of the gold tabs 38 (see FIG. 4). The electrical contact 36 is located on the bent portion 34 of the spring member 23, and is positioned such that the electrical contact 36 is protected from the initial impact between the bent portion 34 and the slanted portion 32 of the nose piece 26 as the printed circuit board 25 is plugged into the connector portion 14. As the spring member 23 is deflected around its fixed end 35, the electrical contact 36 is moved from its impact protected position to a contact making position for making an electrical connection with the gold tab 38. This design minimizes wear on the tab 38 and the electrical contact 36 while allowing wiping action between them to make a good electrical contact. The spring member 23 is made of a bronze alloy and the electrical contact 36 may be gold plated to provide the desired electrical characteristics of the contact-to-tab connection when the printed circuit board is fully inserted into the slot 20.

It will be understood that the tabs 38 form a part, such as input or output connections, of a electrical circuit printed on the printed circuit board 25. Each of the tabs 38 are spaced to be aligned with respective ones of the spring members 23 as the printed circuit board is inserted into the slot 20 such that the contacts 36 may make electrical connection with selected ones of the tabs 38, as desired.

The nose piece 26 is made of a lubricious material to further minimize mechanical damage to the electrical contact 36 during the plug-in operation. The nose piece is further made of electrically insulating material such as Nylon or similar materials to prevent electrical short circuits between the tabs 38 and to allow the printed circuit board 25 to be plugged into an electrically energized circuit without causing electrical damage to the circuit on the board 25 or to the connector 10. The nose piece material is available from E. I. duPont de Nemours & Co. of Wilmington, Del. and is identified as Nylon 101FF and sold under the trademark Zytel. Other materials such as Nylon 66, also available from E. I. duPont de Nemours & Co., may be used. The material Nylon 101FF is preferred. The nose piece 26 is bonded to the leading edge of the printed circuit board 25 by the process of over molding.

While we have illustrated and described the preferred embodiment of our invention, it is to be understood that we do not limit ourselves to the precise construction herein disclosed, and the right is reserved to all changes and modifications coming within the scope of the invention as defined in the appended claims.

Having thus described our invention, what we claim as new, and desire to secure by Letters Patent is:

1. An improved printed circuit board and connector comprising:

spring biased members in said connector, each spring biased member being fixed at a trailing end and having a free, leading end which includes a bent, generally arcuate portion;

an electrical contact located toward said trailing end on the arcuate portion of each of said spring biased members such that when its spring biased member is in an undeflected position, said electrical contact is in an impact protected position, and when its spring biased member is in a deflected position, said electrical contact is moved to a contact making position;

a printed circuit on said printed circuit board for forming an electrical circuit;

a nose piece bonded on an edge of said printed circuit board, said nose piece and said printed circuit board edge for insertion into said connector, said nose piece being shaped for providing sliding engagement with said spring biased members along said arcuate bent portions thereof spaced forwardly of the electrical contacts such that sliding engagement between said nose piece and said spring biased members will protect said spring biased members and said electrical contacts thereon from being damaged by said printed circuit board as said electrical contacts are moved from said impact protected position to said contact making position;

tabs on said printed circuit board electrically connected to said printed circuit, said tabs being adjacent said nose piece and aligned with said spring biased members such that as said spring biased members slide over said nose piece deflecting said spring biased members, said electrical contacts thereon are moved into electrical connection with respective ones of said tabs as said nose piece and said printed circuit board edge are inserted into said connector.

2. The printed circuit board and connector of claim 1 wherein said nose piece is made of a lubricious material.

3. The printed circuit board and connector of claim 2 where said nose piece is made of an electrically insulating material.

4. The printed circuit board and connector of claim 3 wherein said nose piece is made of Nylon material.

5. The printed circuit board and connector of claim 4 wherein said Nylon material is Nylon 101FF.

6. The printed circuit board and connector of claim 1 wherein one edge of said nose piece is slanted to cooperate with the bent portions of said spring biased members to deflect said spring biased members and rotate said electrical contacts into electrical contact with said tabs as said printed circuit board is inserted into said connector.

* * * * *